(12) United States Patent
Zeng et al.

(10) Patent No.: US 7,514,020 B2
(45) Date of Patent: Apr. 7, 2009

(54) SILICOPHOSPHATE-BASED PHOSPHOR AND LIGHT-EMITTING DEVICE INCLUDING THE SAME

(75) Inventors: Xiaoqing Zeng, Yongin-si (KR); Seoung-jae Im, Seoul (KR); Hyung-kun Kim, Suwon-si (KR)

(73) Assignee: Samsung Electro-Mechanics Co., Ltd. (KR)

( * ) Notice: Subject to any disclaimer, the term of this patent is extended or adjusted under 35 U.S.C. 154(b) by 299 days.

(21) Appl. No.: 11/481,272

(22) Filed: Jul. 6, 2006

(65) Prior Publication Data

US 2007/0012936 A1    Jan. 18, 2007

(30) Foreign Application Priority Data

Jul. 6, 2005 (KR) .................. 10-2005-0060879

(51) Int. Cl.
*C09K 11/71* (2006.01)
*C09K 11/59* (2006.01)

(52) U.S. Cl. .................. 252/301.4 F; 252/301.4 P; 313/503; 313/486; 313/487; 257/98

(58) Field of Classification Search ........... 252/301.4 F, 252/301.4 P; 313/486, 487, 503; 257/98
See application file for complete search history.

(56) References Cited

U.S. PATENT DOCUMENTS 6,255,670 B1 * 7/2001 Srivastava et al. ............. 257/89

| | | |
|---|---|---|
| 6,278,135 B1 | 8/2001 | Srivastava et al. |
| 6,294,800 B1 | 9/2001 | Duggal et al. |
| 6,469,322 B1 | 10/2002 | Srivastava et al. |
| 2004/0124758 A1 | 7/2004 | Danielson et al. |

FOREIGN PATENT DOCUMENTS

| JP | 2004292569 | 10/2004 |
|---|---|---|
| KR | 1020010026297 | 4/2001 |
| KR | 1020030063211 | 7/2003 |

* cited by examiner

*Primary Examiner*—C. Melissa Koslow
(74) *Attorney, Agent, or Firm*—Cantor Colburn LLP

(57) ABSTRACT

Provided is a silicophosphate-based phosphor of Formula 1 and a light-emitting device including the same:

$$[(Sr_{(1-x-y-a-b-c)}Ba_aCa_bMg_cEu_xMn_y)_4Si(PO_4)_4] \quad (1)$$

where $0<x\leq0.2$, $0\leq y\leq0.2$, $0\leq a\leq0.2$, $0\leq b\leq0.5$, and $0\leq c\leq0.5$. The silicophosphate-based phosphor of Formula 1 is chemically and thermally stable and can be easily prepared. The phosphor exhibits a high luminous property when excited by a UV LED excitation light source having a wavelength of 360-420 nm, and emits light having a wavelength of 570 to 630 nm. Accordingly, the silicophosphate-based phosphor can be used in a LED, a lamp, a self-emission type liquid crystal display device, or the like. In particular, when a white LED includes the silicophosphate-based phosphor, the color rendering index of the white LED is high and thus an excellent color rendering property can be obtained.

12 Claims, 5 Drawing Sheets

SILICOPHOSPHATE-BASED PHOSPHOR AND LIGHT-EMITTING DEVICE INCLUDING THE SAME

CROSS-REFERENCE TO RELATED PATENT APPLICATIONS

This application claims the benefit of Korean Patent Application No. 10-2005-0060879, filed on Jul. 6, 2005, and all the benefits accruing therefrom under 35 U.S.C. §119, and the contents of which are incorporated herein by reference in its entirety.

BACKGROUND OF THE INVENTION

1. Field of the Invention

The present invention relates to a silicophosphate-based phosphor and a light-emitting device ("LED") including the same, and more particularly, to a silicophosphate-based phosphor having a high luminous efficiency and a high color rendering property and a LED including the same.

2. Description of the Related Art

White LEDs using semiconductors have a longer lifetime and lower operating voltage and can be more easily miniaturized than white electric lamps. Due to these advantages, white LEDs, as an alternative light source to white electric lamps, have a wide range of illumination applications, such as fluorescent lamps for home use or back lights of liquid crystalline display devices.

White LEDs can be obtained by using various methods. For example, three LEDs respectively producing red, green, and blue, which are the three primary colors of light, can be combined to produce white light. Alternatively, a yellow phosphor can be excited using a blue LED as a light source to generate white light. Alternatively, red, green, and blue phosphors can be excited using an ultra violet ("UV") LED as a light source to generate white light.

In particular, the third method described above can be used at a high operating current, and the obtained color quality is good. Consequently, research into this method is actively being conducted.

When white LEDs are provided as described above, red phosphors that can be used are $K_5EU_{2.5}(WO_4)_{6.25}$, $La_2O_2S$:Eu, or the like; green phosphors that can be used are $(Ba,Sr)_2SiO_4$:Eu, or the like; and blue phosphors that can be used are $Sr_5(PO_4)_3Cl$:Eu, or the like.

However, red phosphor exhibits a low luminous efficiency. As a result, a red phosphor having high luminous efficiency needs to be developed to produce a white LED having high efficiency and a high luminous efficiency.

BRIEF SUMMARY OF THE INVENTION

The present invention provides a silicophosphate-based phosphor that has a high luminous efficiency when excited by an ultraviolet (UV) excitation light source and a high color rendering property.

The present invention also provides a light-emitting device (LED), a lamp, a self-emission type liquid crystal display device having a high luminous efficiency and a high color rendering property including the phosphor.

An emission wavelength of the UV LED is 360 to 420 nm. The visible light LED may further include at least one phosphor selected from a blue phosphor and a green phosphor.

According to an aspect of the present invention, there is provided a silicophosphate-based phosphor of Formula 1:

$$(Sr_{(1-x-y-a-b-c)}Ba_aCa_bMg_cEu_xMn_y)_4Si(PO_4)_4 \quad (1)$$

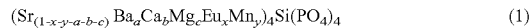

where $0<x\leq0.2$, $0<y\leq0.2$, $0\leq a\leq0.2$, $0\leq b\leq0.5$, and $0\leq c\leq0.5$.

According to yet another aspect of the present invention, there is provided a lamp including the silicophosphate-based phosphor.

According to still another aspect of the present invention, there is provided a self-emission type liquid crystal display device including the silicophosphate-based phosphor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
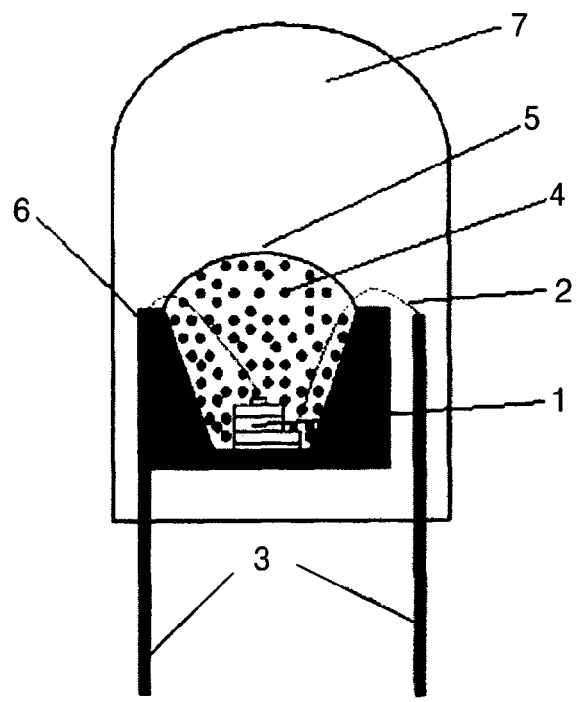
FIG. 1 is a schematic view of a light-emitting device (LED) according to an embodiment of the present invention.

The present invention will now be described in detail with reference to the attached drawings.

The prevent invention provides a silicophosphate-based phosphor according to Formula 1 below. The phosphor exhibits high absorption intensity in a UV region of 200-500 nm, preferably, 360-460 nm, and more preferably, 360-420 nm. The phosphor exhibits a high luminous efficiency in a wavelength range of 570 to 630 nm.

$$(Sr_{(1-x-y-a-b-c)}Ba_aCa_bMg_cEu_xMn_y)_4Si(PO_4)_4 \quad (1)$$

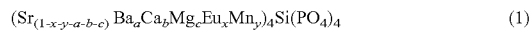

where $0<x\leq0.2$, $0<y\leq0.2$, $0\leq a\leq0.2$, $0\leq b\leq0.5$, and $0\leq c\leq0.5$.

The silicophosphate-based phosphor of Formula 1 contains $Eu^{2+}$ and $Mn^{2+}$ as shown in Formula 1. $Eu^{2+}$ strongly absorbs vacuum ultraviolet ("VUV") light and ultra violet (UV) light phosphor according to the phosphor host lattice and provides the absorbed energy to $Mn^{2+}$. $Mn^{2+}$ weakly absorbs UV light and emits green and red light.

The silicophosphate-based phosphor of Formula 1, which is thermally stable and has excellent chemical properties, emits yellow and red light according to the chemical structure thereof.

The silicophosphate-based phosphor of Formula 1 may also be a phosphor of Formula 2 or Formula 3 below:

$$(Sr_{(1-x-y)}Eu_xMn_y)_4Si(PO_4)_4 \quad (2), \text{ and}$$

where $0<x\leq0.2$, and $0<y\leq0.2$, and $$(Sr_{(1-x-y-b)}Ca_bEu_xMn_y)_4Si(PO_4)_4 \quad (3)$$

where $0<x\leq0.2$, $0<y\leq0.2$, and $0<b\leq0.2$.

Examples of the phosphor of Formula 2 include $(Sr_{0.8}Eu_{0.1}Mn_{0.1})_4Si(PO_4)_4$, $(Sr_{0.76}Eu_{0.07}Mn_{0.17})_4Si(PO_4)_4$, $(Sr_{0.73}Eu_{0.12}Mn_{0.15})_4Si(PO_4)_4$, and the like. Examples of the phosphor of Formula 3 include $((Sr_{0.7}Ca_{0.1}Eu_{0.1}Mn_{0.1})_4Si(PO_4)_4$, $(Sr_{0.74}Ca_{0.02}Eu_{0.07}Mn_{0.17})_4Si(PO_4)_4$, $(Sr_{0.66}Ca_{0.1}Eu_{0.08}Mn_{0.16})_4Si(PO_4)_4$, and the like.

The method of preparing the phosphor of Formula 1 is not limited, and a solid phase method, a liquid phase method, or a vapor phase method can be used. Hereinafter, a solid phase method according to an embodiment of the present invention will be described.

Stoichiometrically required amounts of at least one compound selected from a strontium containing compound, a calcium containing compound, a barium containing compound, and a magnesium containing compound; an europium containing compound; a manganese containing compound; a phosphoric acid compound; and a silicon containing compound are mixed together. The resultant mixture is pulverized as needed, dried, and then sintered at 800 to 1300° C. in a first sintering process.

The sintered product is sintered again in a second sintering process in an atmosphere of a gaseous mixture of hydrogen and nitrogen at 1000 to 1500° C. In this case, the amount of hydrogen of the gaseous mixture is at least 5% by volume.

The first sintering process is performed to remove impurities, such as moisture, organic materials, or complex compounds of salts contained in the mixed product, and to promote crystal growth. When the first sintering process is performed at a temperature below 800° C., crystals are not generated. On the other hand, when the first sintering process is performed at a temperature above 1300° C., the mixed product may include undesired unreacted materials, which can inhibit the second sintering process and thus wavelength conversion efficiency decreases.

When the second sintering process is performed at a temperature below 1000° C., the synthesis reaction does not occur smoothly and thus the desired luminous intensity in the UV wavelength region cannot be obtained. On the other hand, when the second sintering process is performed at a temperature above 1500° C., the target material dissolves at high temperature to form a glass phase, and thus the luminous intensity decreases and desired properties cannot be obtained.

The strontium containing compound may be $SrCO_3$, $SrCl_2 \cdot 6H_2O$, or the like. The calcium containing compound may be $CaCO_3$, $CaCl_2.2H_2O$, or the like. The barium-containing compound may be $BaCO_3$, $BaCl_2$, or the like. The magnesium-containing compound may be MgO, $MgCO_3$, or the like. The europium-containing compound may be $Eu_2O_3$, or the like. The manganese-containing compound may be $MnCO_3$, MnO, $MnCl_2.4H_2O$, or the like. The phosphoric acid compound may be $NH_4H_2PO_4$, $(NH_4)_2HPO_4$, or the like. The silicon containing may be $SiO_2$, $H_2SiO_3$, or the like.

An LED including the phosphor of Formula 1 according to an embodiment of the present invention will now be described in detail.

First, a silicophosphate-based phosphor of Formula 1 described above is mixed with a blue phosphor and a green phosphor to prepare a phosphor composition.

The blue phosphor may be $(Ba, Sr, Ca)_5 (PO_4)_3Cl:Eu$, $BaMgAl_{10}O_{17}:Eu$, $Ba_5SiO_4$, $Sr_5(PO_4)_3Cl:Eu^{2+}$, $BaMg_2Al_{16}O_{27}:Eu^{2+}$, ZnS:Ag, $BaMgAl_{10}O_{17}$, $(Sr, Ca, Ba, Mg)_{10}(PO_4)_6Cl_2:Eu$, or the like (refer to Korean Patent Publication No. KR 2003-63211, the disclosure of which is incorporated herein by reference).

The amount of the blue phosphor may vary according to a desired luminous region, and may be 0.1 to 15 parts by weight, for example, 0.1 to 5 parts by weight, based on 1 part by weight of the green phosphor. When the amount of the blue phosphor is outside this range, color properties of the LED including the phosphor of Formula 1 may deteriorate.

The green phosphor may be $(Ba,Sr)_2SiO_4:Eu$, $Ca_8Mg(SiO_4)_4Cl:Eu,Mn$, $BaMgAl_{10}O_{17}:Eu,Mn$, $BaMg_2Al_{16}O_{27}:Eu,Mn$, $SrGa_2S_4:Eu$, $Ba_2SiO_4:Eu^{2+}$; $Ba_2MgSi_2O_7:Eu^{2+}$, $Ba_2ZnSi_2O_7:Eu^{2+}$; $BaAl_2O_4:Eu^{2+}$; $SrAl_2O_4:Eu^{2+}$, $BaMg_2Al_{16}O_{27}:Eu^{2+}$, $BaMg_2Al_{16}O_{27}:Eu^{2+}, Mn^{2+}$ (refer to U.S. Pat. No. 6,278,135 B1, the disclosure of which is incorporated herein by reference), $(Ba_{1-A-B-C}, Ca_ASr_BEu_C)_2(Mg_{1-W}Zn_W)Si_2O_7$ where $A+B+C \leq 1$, $C>0$, and $0.05 \leq W \leq 0.50$, such as $Ba_2(Mg_{0.50}Zn_{0.50}Si_2O_7:Eu^{2+})$ (refer to U.S. Pat. No. 6,255,670 B1 the disclosure of which is incorporated herein by reference), $Ln_xBO_3:Ce_{3+Y},Tb_{3+Z}$ where $x=1-(y+z)$, $0<x<0.98$, $0.01<y<0.5$, $0.02<z<0.5$, and Ln: 1 or more Sc, Y, La, Gd, Lu, such as $Y_{0.39}Gd_{0.39}BO_3:Ce_{3+0.15},Tb_{3+0.07}$ (refer to U.S. Pat. No. 6,469,322 B1, the disclosure of which is incorporated herein by reference), $Ca_8Mg(SiO_4)_4Cl_2:Eu^{2+}, Mn^{2+}$ (refer to U.S. Pat. No. 6,294,800 B1), $MN_2S_4:Eu$, Ce where M is Mg, Zn, or a mixture of Mg or Zn and at least one material selected from Ba, Sr, and Ca, and N is Al, Ga, or a mixture of Al or Ga and at least one material selected from In, Y, La, and Gd, such as $((Sr_{O.77}Zn_{0.23})_{0.85}Mg_{0.10}Eu_{0.05})Ga_2S_4$ (refer to U.S. Patent Application Publication No. 2004/0124758 A1 the disclosure of which is incorporated herein by reference), $Ca_{3(1-x)}Mg_3Si_4O_{28}:Eu_x$, such as $Ca_{2.94}Mg_3Si_4O_{28}:Eu_{0.02}$ (refer to Japanese Patent Publication No. 2004-292569, the disclosure of which is incorporated herein by reference), ZnS:Cu,Al, $Ca_2MgSi_2O_7:Cl$, $(Ba_{2-x-y-z-a}Sr_xEu_yM_zNa)SiO_{4+d}$ where M contains at least one material selected from La, Ce, Pr, Nd, Pm, Sm, Tb, Gd, Dy, Ho, Er, Tm, Yb, Lu, Y, Sc, Al, Ga, and In, and N contains at least one material selected from Li, Na, and K (refer to Korean Patent Publication No. KR 2001-26297, the disclosure of which is incorporated herein by reference), or the like.

The silicophosphate based phosphor of Formula 1 is used as a red phosphor. The amount of the silicophosphate based phosphor of Formula 1 may vary according to the desired luminous region, and may be 0.1 to 15 parts by weight, for example, 0.1 to 5 parts by weight, based on 1 part by weight of the green phosphor. When the amount of the red phosphor is outside this range, color properties of the LED including the phosphor of Formula 1 may deteriorate.

An LED produced using the phosphor composition described above has a high color rendering index of 90 or higher. As a result, when such an LED is used as an illumination lamp, excellent color rendering properties at almost natural light can be obtained.

FIG. 1 is a schematic view of a polymer lens type surface installation LED according to an embodiment of the present invention. In this case, the polymer lens can be an epoxy lens.

In FIG. 1, a UV light emitting diode chip 1 is die bonded to electric lead wires 3 through Au wires 2, and an epoxy mold layer 5 includes a phosphor composition 4 containing a red phosphor. A reflection layer coated with Al or Ag forms an inner surface of mold 6, reflects light emitted from a diode, and contains a proper amount of epoxy.

An epoxy dome lens 7 is disposed over the epoxy mold layer 5. The shape of the epoxy dome lens 7 may vary according to a desired angle.

The structure of the LED according to the present invention is not limited to the structure illustrated in FIG. 1. For example, the LED may be an LED on which a phosphor is disposed or a shell or a PCB type surface installation LED.

The silicophosphate-based phosphor of Formula 1 according to an embodiment of the present invention can be used in lamps, such as a mercury lamp or a xenon lamp, a self-emission type liquid crystal display (LCD) device, or the like.

Figure 2:
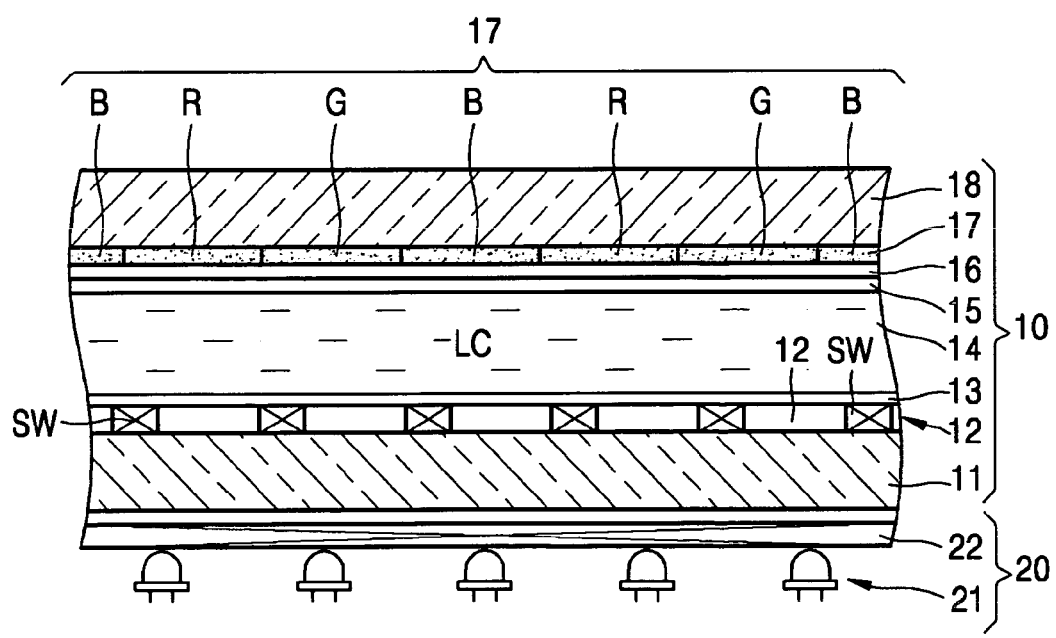
FIGS. 2 and 3 are cross-sectional views of self-emission type liquid crystal display devices according to embodiments of the present invention.

FIG. 2 is a cross-sectional view of a self-emission type LCD device according to an embodiment of the present invention.

Referring to FIG. 2, the self-emission type LCD device according to an embodiment of the present invention includes a display panel 10 and a UV backlight 20.

The UV backlight 20 uses a UV LED having a UV light emitting diode chip therein (see FIG. 1) with an emission wavelength of, for example, 360 to 460 nm. The UV LED is produced using the phosphor of Formula 1 (see phosphor composition 4 in FIG. 1). The display panel 10 includes a front panel 18, a rear panel 11 that is separated from the front panel 18 by a predetermined distance, and a liquid crystal ("LC") layer 14 interposed between the front panel 18 and the rear panel 11.

An emission layer 17 including a red emission region ("R"), a green emission region ("G"), and a blue emission region ("B"), a common electrode 16, and an upper orientation layer 15 are sequentially formed on an inner surface of the front panel 18. A TFT switching ("SW") device as a liquid crystal driving circuit and a pixel electrode 12 are formed on an inner surface of the rear panel 11, and a lower orientation layer 13 is formed thereon. In this case, a polarization device (not shown), which can be used in an LCD, is used in such a structure described above, and in particular, the polarization device is disposed in front of the emission layer 17 in a UV light pathway. The emission layer 17 includes quantum dots ("QD") formed in particles or a thin film. For example, a red (R) emission layer having the lowest efficiency contains QDs.

A UV filter 19 (see FIG. 3) is optionally disposed on an external surface of the front panel 18. The UV filter 19 may be a chemical blocking agent that absorbs UV light, or a physical blocking agent that reflects or disperses incident UV light.

The UV backlight 20 disposed close to an external surface of the rear panel 11 includes UV lamps 21 and a light guide/diffuse member 22. The UV lamps 21 are UV LEDs or mercury lamps as described above. The light guide/diffuse member 22 guides UV light emitted from the UV lamps 21 to the rear panel 11 and uniformly diffuses the UV light.

The use of the light guide/diffuse member 22 is optional. The light guide/diffuse member 22 has a size corresponding to the entire external surface of the rear panel 11. For example, when the UV lamps 21 are UV LEDs, a plurality of UV LEDs are closely, horizontally disposed together. Such a light source that provides UV light to the entire external surface of a LCD is required to obtain a large-sized LCD.

Figure 3:
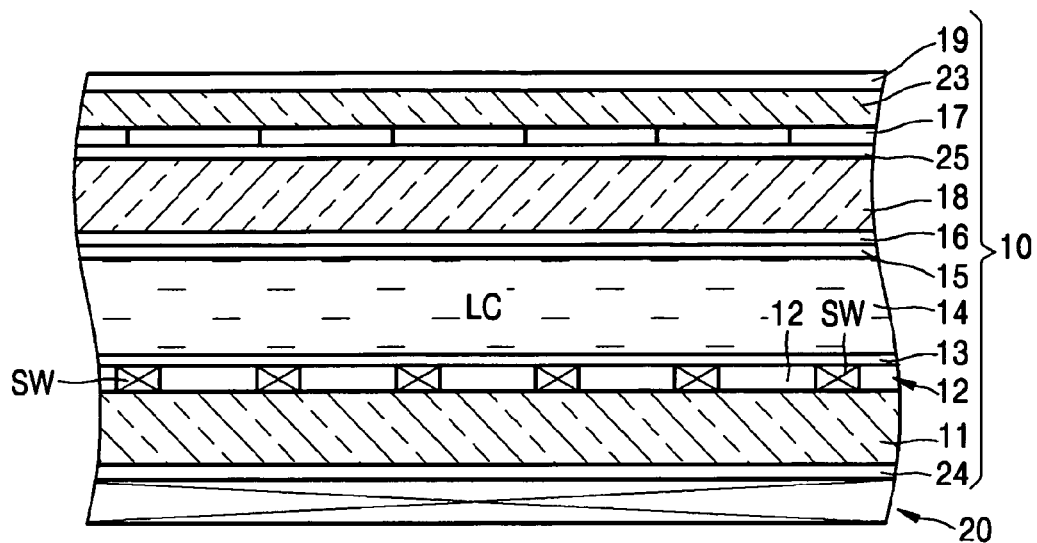

FIG. 3 is a cross-sectional view of a self-emission type LCD device according to another embodiment of the present invention. The LCD illustrated in FIG. 2 is different from the LCD illustrated in FIG. 3 in locations of the emission layer 17 and the UV filter 19. Referring to FIG. 3, the LCD includes a display panel 10 and a UV backlight 20.

In the display panel 10, a front panel 18 and a rear panel 11 are separated by a predetermined distance, and a liquid crystal ("LC") layer 14 is interposed therebetween.

A common electrode 16 and an upper orientation layer 15 are sequentially formed on an inner surface of the front panel 18. A switching (SW) device, such as a thin film transistor ("TFT"), and a pixel electrode 12 are formed on an inner surface of the rear panel 11, and a lower orientation layer 13 is formed thereon.

Polarization planes 25 and 24 are disposed on external surfaces of the front panel 18 and the rear panel 11, respectively. An emission layer 17, which emits a desired color when excited by UV light, is formed on the polarization plane 25 formed on the front panel 18. The emission layer 17 absorbs UV light of 360 to 460 nm wavelength to provide a desired color, as described above. A protective substrate 23 covers the emission layer 17, and a filter 19 is formed on the protective substrate 23 to block UV light, whose wavelength is shorter than the emission wavelength of the emission layer.

The UV filter 19 may be a chemical blocking agent that absorbs UV light, or a physical blocking agent that reflects or disperses incident UV light, as described above.

The present invention will be described in further detail with reference to the following examples. These examples are for illustrative purposes only and are not intended to limit the scope of the present invention.

SYNTHESIS EXAMPLE 1

Preparation of $(Sr_{0.76}Eu_{0.08}Mn_{0.16})_4Si(PO_4)_4$ 5.385 g of $SrCO_3$, 0.675 g of $Eu_2O_3$, 0.883 g of $MnCO_3$, 0.721 g of $SiO_2$, 5.52 g of $NH_4H_2PO_4$ were mixed using an agate mortar. The resultant mixture was heat treated at 800-1000° C. in an air atmosphere for about 2 hours. The heat-treated product was heat treated again at about 1000-1200° C. in an atmosphere of 5% by volume of $H_2$ and 95% by volume of $N_2$ for 4 hours. The twice heat-treated product was pulverized to produce a powder of $(Sr_{0.76}Eu_{0.08}Mn_{0.16})_4Si(PO_4)_4$.

Figure 4:
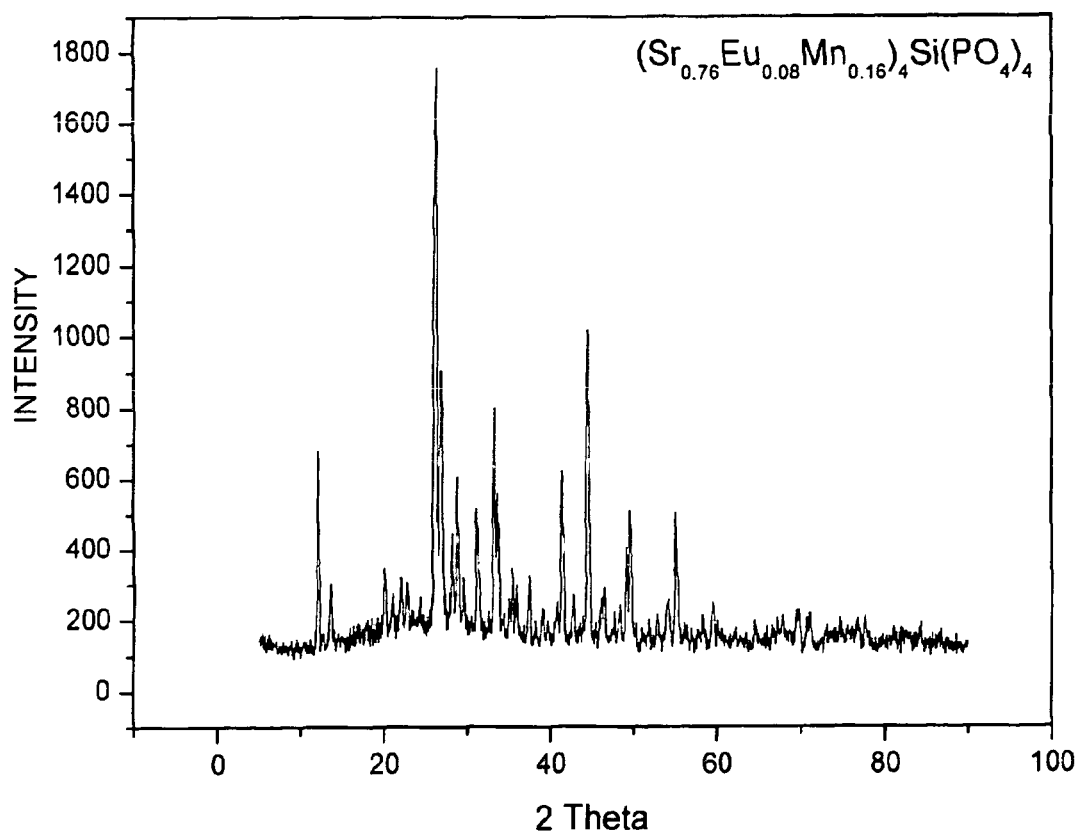
FIGS. 4 and 5 show X ray diffraction ("XRD") spectra of phosphors prepared according to Synthesis Example 1 and Synthesis Example 2.

X-ray diffraction (XRD) of the powder was measured. The results are shown in FIG. 4.

SYNTHESIS EXAMPLE 2

Preparation of $(Sr_{0.66}Ca_{0.1}Eu_{0.08}Mn_{0.16})_4Si(PO_4)_4$ 4.677 g of $SrCO_3$, 0.48 g of $CaCO_3$, 0.675 g of $Eu_2O_3$, 0.883 g of $MnCO_3$, 0.721 g of $SiO_2$, and 5.52 g of $NH_4H_2PO_4$ were mixed using an agate mortar. The resultant mixture was heat treated at 800-1000° C. in an air atmosphere for about 2 hours. The heat-treated product was heat treated again at about 1000-1200° C. in an atmosphere of 5% by volume of $H_2$ and 95% by volume of $N_2$ for 4 hours. The twice heat-treated product was pulverized to produce a powder of $((Sr_{0.66}Ca_{0.1}Eu_{0.08}Mn_{0.16})_4Si(PO_4)_4$.

X-ray diffraction (XRD) of the powder was measured. The results are shown in FIG. 5.

Figure 5:
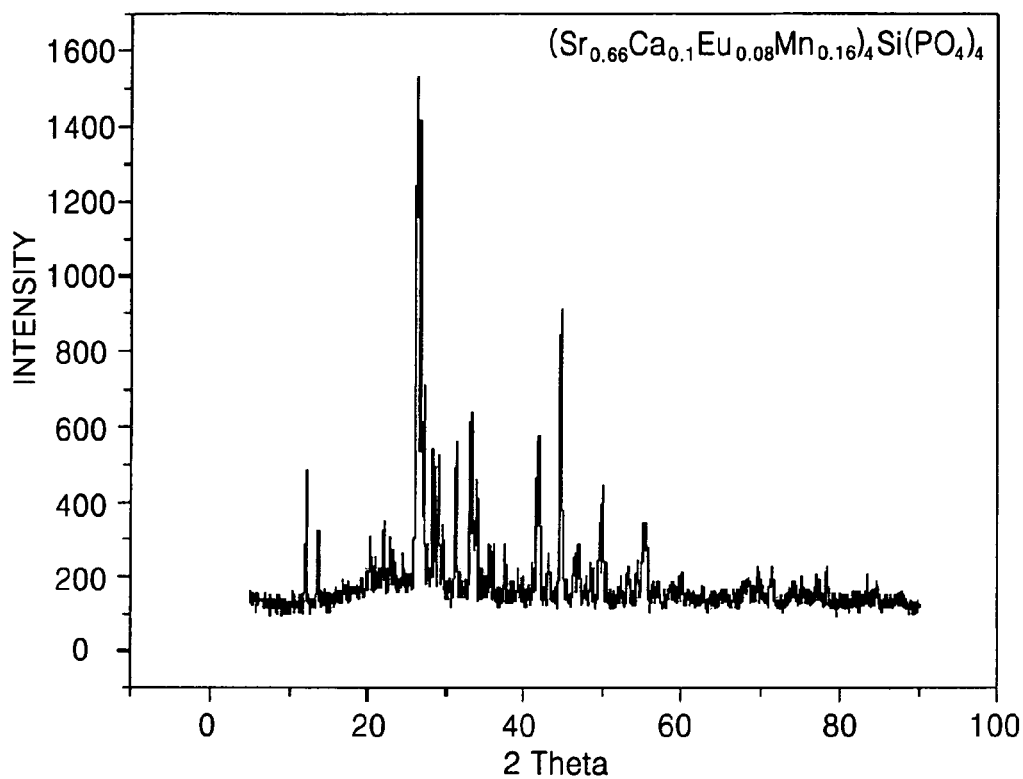

Structures of compounds prepared according to Synthesis Examples 1 and 2 were determined with reference to FIGS. 4 and 5.

Absorption spectra of phosphors prepared according to Synthesis Examples 1 and 2 were measured. The results are shown in FIG. 6.

Figure 6:
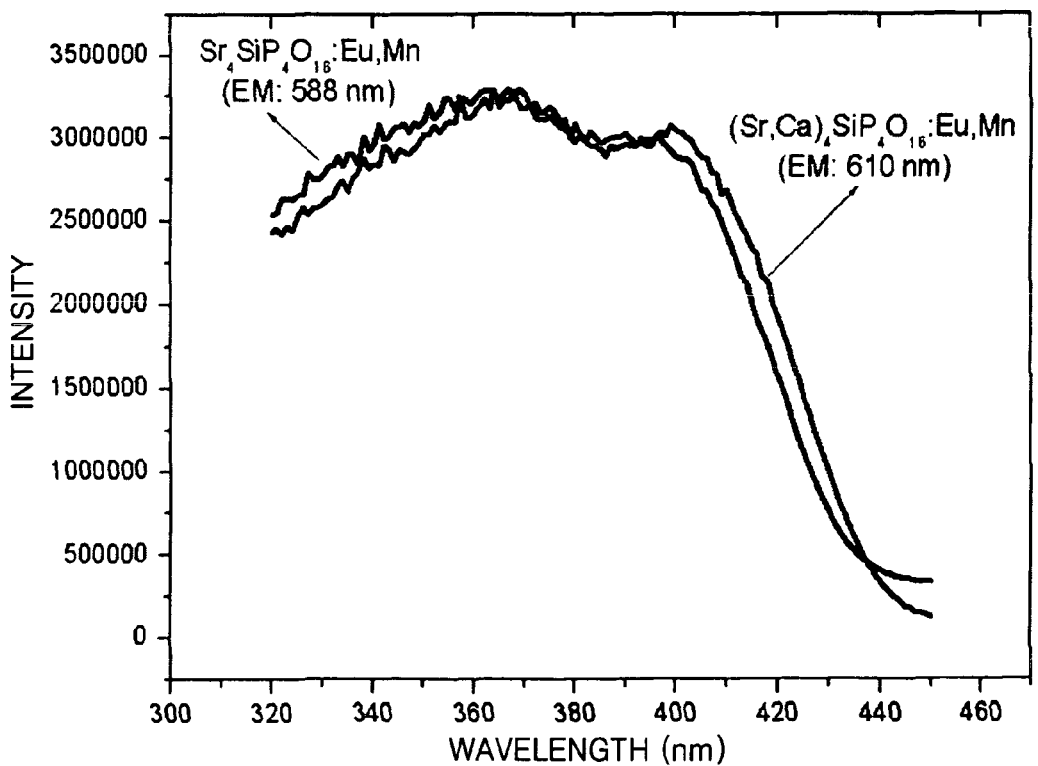
FIG. 6 shows absorption spectra of phosphors prepared according to Synthesis Example 1 and Synthesis Example 2.

In FIG. 6, the phosphors exhibited high intensities in a wavelength range of 320 to 450 nm.

Emission spectra of the phosphors prepared according to Synthesis Examples 1 and 2 were measured. The results are shown in FIG. 7.

Figure 7:
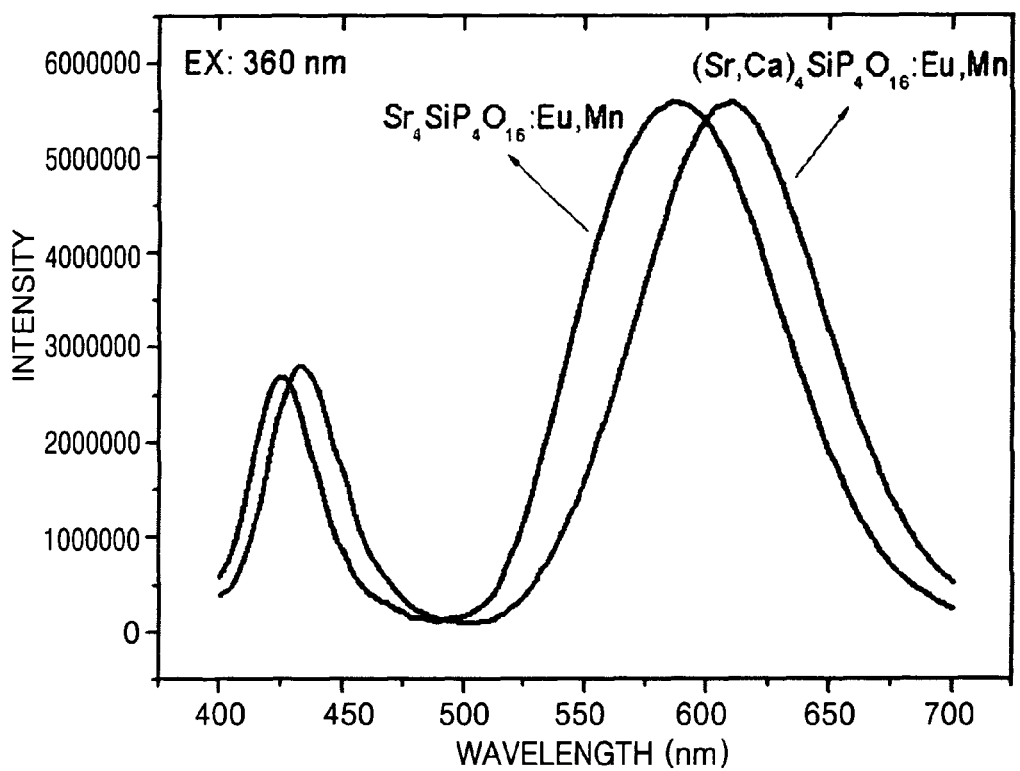
FIG. 7 shows emission spectra of phosphors prepared according to Synthesis Example 1 and Synthesis Example 2.

FIG. 7 shows emission spectra of the phosphors prepared according to Synthesis Examples 1 and 2 when excited by an excitation light having a wavelength of about 360 nm. Referring to FIG. 7, strong yellow and orange light was emitted in a wavelength range of 580 to 610 nm, and a weak blue light was emitted at a wavelength of around 430 nm.

EXAMPLE 1

Preparation of White LED

In order to manufacture a white LED illustrated in FIG. 1, $((Sr_{0.66}Ca_{0.1}Eu_{0.08}Mn_{0.16})_4 Si(PO_4)_4$ prepared according to Synthesis Example 2 was used as a red phosphor, $(Sr,Ba,Ca)_5(PO_4)_3Cl:Eu$ was used as a blue phosphor, $(Ba,Sr)_2SiO_4:Eu$ was used as a green phosphor, and UV LED (wavelength of about 390 nm) was used as an excitation light source.

An emission spectrum of the white LED prepared according to Example 1 was measured. The results are shown in FIG. 8.

Figure 8:
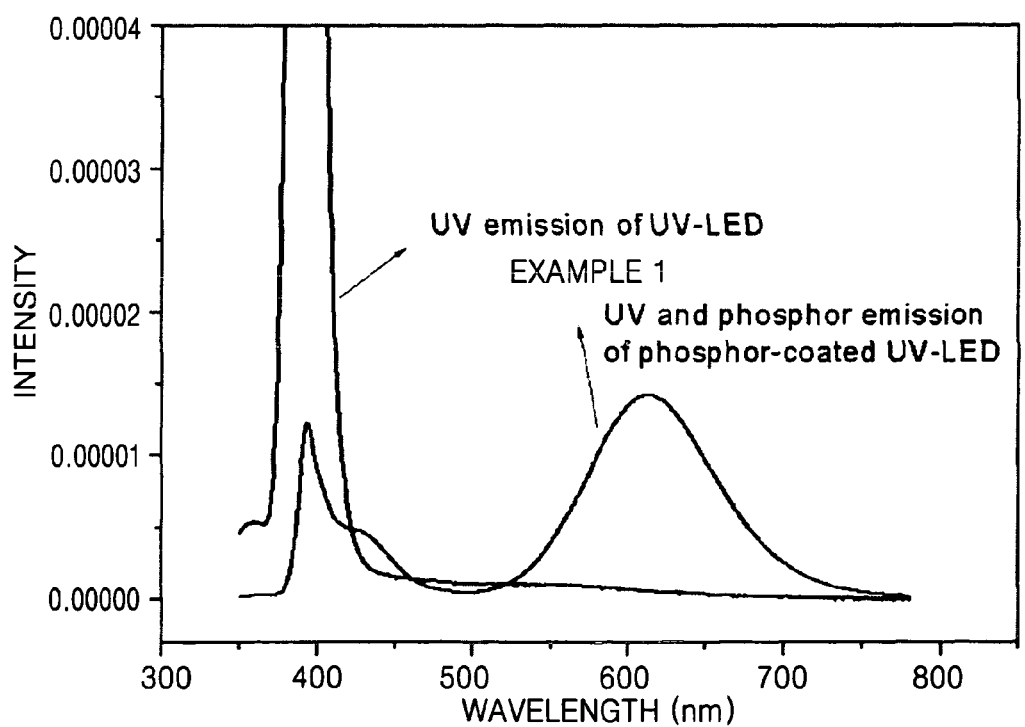
FIG. 8 shows an emission spectrum of a white LED produced according to Example 1.

Referring to FIG. 8, it was found that yellow and red light were emitted.

The color rendering index ("CRI") of the LED prepared according to Example 1 was measured to determine the color rendering property. The results are shown in FIG. 9.

Figure 9:
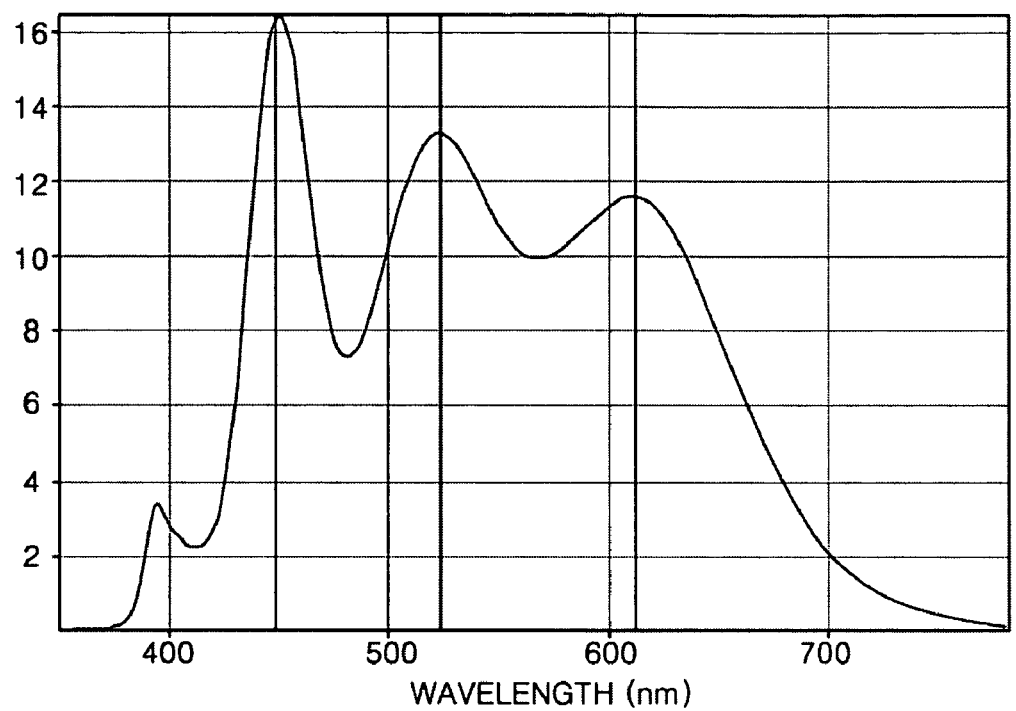
FIG. 9 shows a graph of a color rendering property of a white LED produced according to Example 1.

Referring to FIG. 9, the LED exhibited an improved color rendering when a UV LED, tungsten based $K_5Eu(WO_4)_{6.5}$ as a red phosphor, $(Sr,Ba,Ca)_5(PO_4)_3Cl:Eu$ as a blue phosphor, and $(Ba,Sr)_2SiO_4:Eu$ as a green phosphor were used.

The correlated color temperature ("CCT") of the LED manufactured according to Example 1 was 5771 K.

A silicophosphate-based phosphor of Formula 1 is chemically and thermally stable and can be easily prepared. The phosphor exhibits a high luminous property when excited by a UV LED excitation light source having a wavelength of 360 to 420 nm, and emits light having a wavelength of 570 to 630 nm. Accordingly, the silicophosphate-based phosphor according to the present invention can be used in a LED, a lamp, a self-emission type liquid crystal display device, or the like. In particular, when a white LED includes the silicophosphate-based phosphor of the present invention, the color-rendering index of the white LED is high and thus an excellent color rendering property can be obtained.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A silicophosphate-based phosphor of Formula 1:

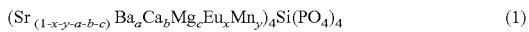  (1)

where $0<x\leq0.2$, $0<y\leq0.2$, $0\leq a\leq0.2$, $0\leq b\leq0.5$, and $0\leq c\leq0.5$.

2. The silicophosphate-based phosphor of claim 1, represented by Formula 2:

$(Sr_{(1-x-y)}Eu_xMn_y)_4Si(PO_4)_4$  (2)

where $0<x\leq0.2$, $0<y\leq0.2$.

3. The silicophosphate-based phosphor of claim 1, represented by Formula 3:

$(Sr_{(1-x-y-b)}Ca_bEu_xMn_y)_4Si(PO_4)_4$  (3)

where $0<x\leq0.2$, $0<y\leq0.2$, and $0<b\leq0.5$.

4. The silicophosphate-based phosphor of claim 1, being $(Sr_{0.8}Eu_{0.1}Mn_{0.1})_4Si(PO_4)_4$, $(Sr_{0.76}Eu_{0.07}Mn_{0.17})_4Si(PO_4)_4$, $((Sr_{0.7}Ca_{0.1}Eu_{0.1}Mn_{0.1})_4Si(PO_4)_4$, $(Sr_{0.74}Ca_{0.02}Eu_{0.07}Mn_{0.17})_4Si(PO_4)_4$, or $(Sr_{0.66}Ca_{0.1}Eu_{0.08}Mn_{0.16})_4Si(PO_4)_4$.

5. A visible light-emitting device comprising:
an ultraviolet light-emitting device; and
the silicophosphate-based phosphor of claims 1.

6. The visible light-emitting device of claim 5, wherein an emission wavelength of the ultraviolet light-emitting device is 360 to 460 nm.

7. The visible light-emitting device of claim 6, wherein an emission wavelength of the ultraviolet light-emitting device is 360 to 420 nm.

8. The visible light-emitting device of claim 5, further comprising at least one phosphor selected from a blue phosphor and a green phosphor.

9. A method of preparing a silicophosphate-based phosphor comprising mixing
a stoichiometric amount of at least one compound selected from a strontium containing compound, a calcium containing compound, a barium containing compound, and a magnesium containing compound;
an europium containing compound;
a manganese containing compound;
a phosphoric acid compound; and
a silicon containing compound,
sintering the mixture at 800 to 1300° C. in a first sintering process, and, sintering the product of the first sintering process at 1000 to 1500° C. in a second sintering process, wherein the second sintering process is conducted in an atmosphere of a gaseous mixture of hydrogen and nitrogen.

10. The method of claim 9, wherein the amount of hydrogen of the gaseous mixture is at least 5% by volume.

11. The method of claim 9, wherein the silicophosphate-based phosphor prepared by the method has Formula 1:

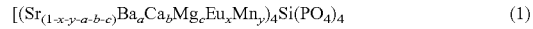  (1)

Where $0<x\leq0.2$, $0<y\leq0.2$, $0\leq a\leq0.2$, $0\leq b\leq0.5$, and $0\leq c\leq0.5$.

12. The visible light-emitting device of claim 8, wherein the visible light emitting device is a white light emitting device further comprising a blue pholphor and a green phosphor.

* * * * *